(12) United States Patent
Sugino et al.

(10) Patent No.: US 6,277,481 B1
(45) Date of Patent: Aug. 21, 2001

(54) ADHESIVE COMPOSITION AND ADHESIVE SHEET

(75) Inventors: Takashi Sugino; Hideo Senoo, both of Kawaguchi; Yasukazu Nakata, Matsudo, all of (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/347,634

(22) Filed: Jul. 6, 1999

(30) Foreign Application Priority Data

Jul. 6, 1998 (JP) .................................................. 10-190491

(51) Int. Cl.$^7$ .................................. B32B 7/12; C08F 8/00
(52) U.S. Cl. .......................... 428/317.1; 525/88; 525/90; 525/92; 525/94; 525/100; 525/101; 525/107; 525/185; 525/234; 524/81; 524/403; 524/442; 428/221; 428/304.4; 428/305.5; 428/312.6; 428/312.8; 428/317.7; 428/319.3
(58) Field of Search .................... 525/88, 90, 92, 525/94, 100, 101, 107, 185, 234; 524/81, 403, 442; 428/221, 304.4, 305.5, 312.6, 312.8, 317.1, 317.7, 319.3

(56) References Cited

U.S. PATENT DOCUMENTS

| | | | |
|---|---|---|---|
| 3,326,741 | 6/1967 | Olson | 161/184 |
| 3,753,755 | 8/1973 | Olson | 117/3.1 |
| 5,110,388 | 5/1992 | Komiyama et al. | 156/229 |
| 5,118,567 | 6/1992 | Komiyama et al. | 428/345 |
| 5,356,949 | 10/1994 | Komiyama et al. | 522/102 |

FOREIGN PATENT DOCUMENTS

| | | |
|---|---|---|
| 0771835 | 5/1997 | (EP) . |
| 0775715 | 5/1997 | (EP) . |
| 60-196956 | 10/1985 | (JP) . |
| 60-223139 | 11/1985 | (JP) . |
| 07015087 | 2/1995 | (JP) . |
| 08-48949 | 2/1996 | (JP) . |
| 08053655 | 2/1996 | (JP) . |
| 08239636 | 9/1996 | (JP) . |
| 09100450 | 4/1997 | (JP) . |
| 09202872 | 8/1997 | (JP) . |
| 09-302313 | 11/1997 | (JP) . |

*Primary Examiner*—Samuel A. Acquah
(74) *Attorney, Agent, or Firm*—Webb Ziesenheim Logsdon Orkin & Hanson, P.C.

(57) ABSTRACT

An adhesive composition comprising a pressure sensitive adhesive component (A), a thermosetting adhesive component (B) and a compound (C) obtained by addition/condensation reaction of a polysiloxane oligomer with a silane coupling agent. This composition is excellent in storage stability and can bond metals, etc. with large bonding strength. Further, sheeting thereof enables simplifying bonding steps.

26 Claims, No Drawings

ADHESIVE COMPOSITION AND ADHESIVE SHEET

FIELD OF THE INVENTION

The present invention relates to a novel adhesive composition and adhesive sheet. More particularly, the present invention relates to an adhesive composition which is excellent in storage stability and can bond metals, etc. with large bonding strength and whose sheeting enables simplifying bonding steps, and relates to an adhesive sheet comprising the composition.

BACKGROUND OF THE INVENTION

The epoxy resin adhesive has most widely been used to bond metals with each other. However, bonding with satisfactory strength cannot always be accomplished by the epoxy resin adhesive because a lowering of bonding strength may be caused by, for example, the shrinkage of epoxy resin adhesive at the time of curing reaction. In particular, when the epoxy resin adhesive is of one component adhesive type, and a trigger such as heat is employed at the time of curing reaction, the bonding strength tends to decrease because internal stress is centralized at the bonding portion due to the difference in thermal expansion coefficient from those of metals as adherends.

Moreover, the epoxy resin adhesive is generally liquid, so that the bonding step is likely to become burdensome. That is, it is difficult to apply an appropriate amount of adhesive to an adherend surface, and problems such as liquid runs are encountered.

In order to resolve these problems of the liquid adhesive, various sheeted adhesives have been developed and put on the market. However, the conventional sheeted adhesives have drawbacks in that their storage stability is poor and, when bonding and curing are conducted after long-term storage, satisfactory bonding strength (peeling strength) cannot be obtained.

The present invention has been made taking the above prior art into account. Accordingly, the present invention provides an adhesive composition which is excellent in storage stability and can bond metals, etc. with large bonding strength and whose sheeting enables simplifying bonding steps, and provides an adhesive sheet comprising the composition.

SUMMARY OF THE INVENTION

The adhesive composition of the present invention comprises a pressure sensitive adhesive component (A), a thermosetting adhesive component (B) and a compound (C) obtained by addition/condensation reaction of a polysiloxane oligomer with a silane coupling agent.

According to necessity, the adhesive composition of the present invention can further be blended with a flexible component (D), a heat-active latent curing agent (E), a matrix forming component (F) and/or a filler (G). The filler (G) is preferably a conductive filler.

The above adhesive composition of the present invention is excellent in storage stability, can bond metals, etc. with large bonding strength and can be sheeted with the result that an appropriate amount of adhesive can be transferred to an adherend surface and liquid runs can be avoided to thereby enable simplifying the bonding steps.

Thus, the adhesive sheet of the present invention comprises the adhesive composition of the present invention.

DETAILED DESCRIPTION OF THE INVENTION

The adhesive composition of the present invention and the method of using the same will be described in detail below.

The adhesive composition of the present invention comprises, as essential components, a pressure sensitive adhesive component (A), a thermosetting adhesive component (B) and a compound (C) obtained by addition/condensation reaction of a polysiloxane oligomer with a silane coupling agent. According to necessity, the adhesive composition of the present invention can further be loaded with a flexible component (D), a heat-active latent curing agent (E), a matrix forming component (F) and/or a filler (G).

Various common pressure sensitive adhesives can be used as the pressure sensitive adhesive component (A) without any particular limitation. In the present invention, acrylic, rubber and polyester pressure sensitive adhesives are preferably used. Of these, acrylic pressure sensitive adhesives are especially preferred.

Examples of the acrylic pressure sensitive adhesives include (meth)acrylic ester copolymers whose structural units are derived from a (meth)acrylic ester monomer and a (meth)acrylic acid derivative. Cycloalkyl (meth)acrylates, benzyl (meth)acrylate and alkyl (meth)acrylates having an alkyl group of 1 to 18 carbon atoms can be used as the (meth) acrylic ester monomer. Of these, alkyl (meth) acrylates having an alkyl group of 1 to 18 carbon atoms can be used as the (meth)acrylic ester monomer. For example, methyl acrylate, methyl methacrylate, ethyl acrylate, ethyl methacrylate, propyl acrylate, propyl methacrylate, butyl acrylate and butyl methacrylate are especially preferred. The (meth)acrylic acid derivative can be selected from among, for example, (meth)acrylic acid, hydroxyethyl (meth)acrylate and glycidyl (meth)acrylate.

When glycidyl (meth)acrylate is used as the (meth)acrylic acid derivative, the content of units derived from the glycidyl (meth) acrylate in the obtained copolymer is generally in the range of 0 to 80 mol %, preferably 5 to 50 mol %. The incorporation of the glycidyl group increases the compatibility with the below described epoxy resin as the thermosetting adhesive component and also increases the temperature Tg after curing and the heat resistance. When (meth)acrylic acid is used as the (meth)acrylic acid derivative, the content of units derived from (meth)acrylic acid in the obtained copolymer is generally in the range of 0 to 40 mol %, preferably 5 to 20 mol %. The incorporation of a hydroxyl containing monomer such as hydroxyethyl acrylate facilitates the controlling of adherence to adherends and pressure sensitive adhesive properties.

The molecular weight of the acrylic pressure sensitive adhesives is preferably at least 100,000, still preferably in the range of 150,000 to 1,000,000. The glass transition temperature of the acrylic pressure sensitive adhesives is generally up to 20° C., preferably in the range of approximately −70 to 0° C. At ordinary temperature (23° C.), the acrylic pressure sensitive adhesives have pressure sensitive adhesive properties.

The thermosetting adhesive component (B) is capable of forming a three-dimensional network upon being heated, although not cured by energy radiation, to thereby possess properties of bonding adherends with large strength. This thermosetting adhesive component (B) generally consists of a thermosetting resin such as an epoxy resin, a phenolic resin, a resorcinol resin, a urea resin, a melamine resin, a furan resin, an unsaturated polyester resin, a polyurethane resin or a silicone resin. Various thermosetting adhesive components are known, and these can be used in the present invention without any particular limitation. In the present invention, epoxy resins are especially preferably used as the thermosetting adhesive component (B).

Although various common epoxy resins can be used as the above epoxy resin, it is generally preferred to employ those having a molecular weight of about 300 to 2000, especially blends of an ordinarily liquid epoxy resin of 300 to 1000, desirably 330 to 800, in molecular weight and an ordinarily solid epoxy resin of 400 to 2500, desirably 800 to 2000, in molecular weight. The epoxy equivalent of epoxy resins preferably employed in the present invention is generally in the range of 50 to 5000 g/eq. Examples of these epoxy resins include:

glycidyl ethers of phenols such as bisphenol A, bisphenol F, resorcinol, phenylnovolak and cresol novolak;

glycidyl ethers of alcohols such as butanediol, polyethylene glycol and polypropylene glycol;

glycidyl ethers of carboxylic acids such as phthalic acid, isophthalic acid and tetrahydrophthalic acid;

glycidyl or alkylglycidyl epoxy resins obtained by substituting an active hydrogen bonded to a nitrogen atom of aniline isocyanurate or the like with a glycidyl group; and compounds, known as alicyclic epoxides, obtained by, for example, oxidizing an intramolecular carbon to carbon double bond to thereby incorporate an epoxy group therein, such as vinylcyclohexane diepoxide, 3,4-epoxycyclohexylmethyl-3,4-dicyclohexanecarboxylate and 2-(3,4-epoxy)cyclohexyl-5,5-spiro(3,4-epoxy)cyclohexane-m-dioxane.

Of these, bisphenol glycidyl epoxy resins, o-cresol novolak epoxy resins and phenolic novolak epoxy resins are preferred in the present invention.

These epoxy resins can be used either individually or in combination.

The thermosetting resin of the thermosetting adhesive component (B) and the later described flexible component (D) can be composed of previously modified resins. These modified resins are called, in particular, alloy modified resins or rubber blend modified resins.

The adhesive composition of the present invention comprises a compound (C) obtained by addition/condensation reaction of a polysiloxane oligomer with a silane coupling agent in addition to the above components (A) and (B). The polysiloxane oligomer for use in the preparation of the compound (C) is, for example, polymethoxysiloxane or polyethoxysiloxane. Polysiloxane oligomers having a molecular weight of 400 to 1200 are especially preferred. Various commercially available silane coupling agents can be used as the above silane coupling agent which is subjected to addition/condensation reaction with the polysiloxane oligomer. Examples thereof include γ-glycidoxypropyltrimethoxysilane, β-(3,4-epoxycyclohexyl)ethyltrimethoxysilane, γ-methacryloxypropyltrimethoxysilane, vinyl-γ-aminopropyltriethoxysilane and N-phenyl-γ-aminopropyltrimethoxysilane.

The compound (C) obtained by addition/condensation reaction of the above polysiloxane oligomer with the silane coupling agent is represented by, for example, the formula:

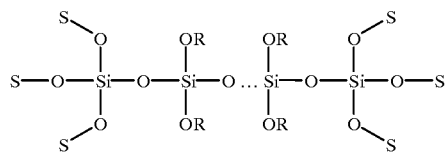

In the above formula, R represents methyl or ethyl, and S represents R or a group introduced by the silane coupling agent. Preferably at least two groups introduced by the silane coupling agent are contained in each molecule of the compound (C).

Examples of the groups introduced by the silane coupling agent include polymerizable groups such as acryloyl, glycidyl, amino and vinyl groups. Specific examples of these groups introduced by the silane coupling agent are as shown below:

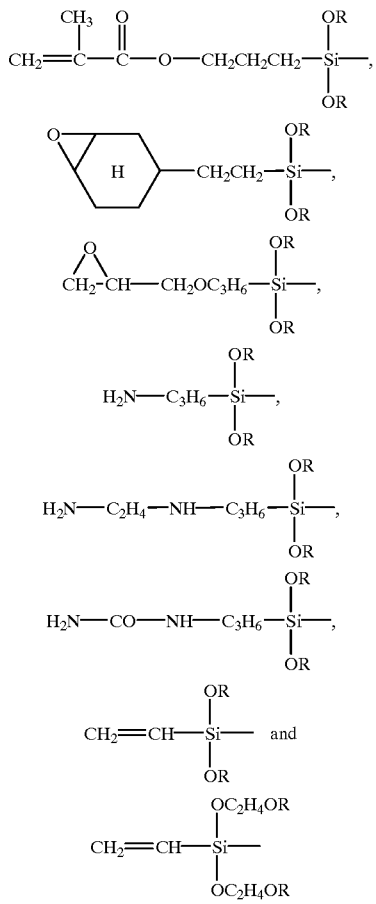

In the above formulae, R represents methyl or ethyl.

Although various coupling agents have heretofore been added to adhesives for the purpose of, for example, improving the adherence to metal adherends and the capability with inorganic fillers, these conventional coupling agents do not exert any improving effect on the storage stability of the adhesive and the curing adhesion after aging. In the present invention, the addition of the above compound (C) in place of the various conventional coupling agents enables magnificently enhancing not only the above adherence but also the storage stability. In particular, these effects are marked with respect to the pressure sensitive adhesive (in the form of a sheet or a film) stored at ordinary temperature. In the transportation during summer as well, the drop of the curing adhesion can be prevented.

The adhesive composition of the present invention can be obtained by mixing together the pressure sensitive adhesive component (A), the thermosetting adhesive component (B) and the compound (C) obtained by addition/condensation reaction of a polysiloxane oligomer with a silane coupling agent in the customary manner.

The thermosetting adhesive component (B) is preferably used in an amount of 50 to 800 parts by weight, still preferably 100 to 600 parts by weight, per 100 parts by weight of the pressure sensitive adhesive component (A) The compound (C) is preferably used in an amount of 0.05 to 5 parts by weight, still preferably 0.1 to 3 parts by weight, per 100 parts by weight of the thermosetting adhesive component (B).

According to necessity, the adhesive composition of the present invention may be blended with a flexible component (D), a heat-active latent curing agent (E), a matrix forming component (F) and/or a filler (G) in addition to the above components (A) to (C).

The flexible component (D) is a component which has flexibility even when the thermosetting adhesive component (B) is in a cured state, and is composed of a thermoplastic resin or an elastomer. It is generally preferred that the flexible component (D) be used in an amount of 1 to 40 parts by weight, especially 4 to 30 parts by weight, and still especially 4 to 25 parts by weight, per 100 parts by weight of the thermosetting adhesive component (B).

The glass transition temperature Tg of the flexible component (D) is preferably in the range of about −40 to 80° C., still preferably about −30 to 10° C.

The molecular weight of the flexible component (D) is preferably in the range of about 10,000 to 1,000,000, still preferably about 20,000 to 600,000. However, this is not applicable when the flexible component (D) has an internal crosslinking.

The flexible component (D) is a component which is substantially not cured by energy radiation or heating, and may be a polymer or a graft or block component of polymer.

The flexible component (D) is uniformly dispersed in the cured adhesive layer and functions to improve the brittleness of the cured adhesive layer so that the pressure sensitive adhesive layer comes to possess a resistance to external stress. Further, from the viewpoint of the above improving effect, it is preferred that the flexible component (D) be uniformly dispersed or mixed in the thermosetting adhesive component (B). Accordingly, it is preferred that the flexible component (D) be in the form of fine particles or be soluble or easily soluble in an organic solvent such as toluene or methyl ethyl ketone. When the flexible component (D) is in the form of fine particles, the particle size thereof is preferably in the range of 0.1 to 5 μm, still preferably 0.1 to 1 μm.

Even when the flexible component (D) which is soluble or easily soluble in an organic solvent is used, it is known that, during the curing process, the flexible component (D) undergoes a phase separation from the thermosetting adhesive component (B) to thereby have a two-phase structure. The flexible component (D) which is soluble or easily soluble in an organic solvent can be composed of any of a saturated polyester resin, a liquid nitril-butadiene rubber (NBR), a liquid chloroprene rubber, a urethane rubber, a polyolefin resin, a silicone oil and the like. Of these, a saturated polyester resin is especially preferred.

The flexible component (D) having the form of fine particles can be composed of any of acrylic rubber fine particles prepared by the emulsion polymerization, a block polyester elastomer such as a polyether polyester, polyethylene fine particles, silicone rubber fine particles and the like. Of these, acrylic rubber fine particles and a block polyester elastomer are especially preferred.

The above fine particle flexible component (D) may be commercially available in the state of being dispersed in an epoxy resin as the thermosetting adhesive component (B)

As mentioned above, the thermosetting resin of the thermosetting adhesive component (B) and the flexible component (D) can be composed of previously modified resins. These modified resins are called, in particular, alloy modified resins or rubber blend modified resins.

Examples of these modified resins include various rubber modified epoxy resins (NBR modified, CTBN modified epoxy resins or the like), urethane modified epoxy resins and silicone modified epoxy resins.

Examples of the rubber modified epoxy resins include Adeka Resin EP-4023 (trade name, produced by Asahi Denka Kogyo K.K.), Adeka Resin EP-4024 (trade name, produced by Asahi Denka Kogyo K.K.), Adeka Resin EP-4026 (trade name, produced by Asahi Denka Kogyo K. K.) and Adeka Resin EPR-20 (trade name, produced by Asahi Denka Kogyo K.K.).

Examples of the urethane modified epoxy resins include Adeka Resin EPU-6 (trade name, produced by Asahi Denka Kogyo K.K.), Adeka Resin EPU-73 (trade name, produced by Asahi Denka Kogyo K.K.) and Adeka Resin EPU-78-11 (trade name, produced by Asahi Denka Kogyo K.K.).

The heat-active latent curing agent (E) is a curing agent which does not react with thermosetting resins (i.e., thermosetting adhesive component (B)) at room temperature and which is activated by heating to a given temperature or higher to thereby react with thermosetting resins.

The activation of heat-active latent curing agent (E) can be performed by various methods, for example, the method in which a chemical reaction is induced by heating to thereby form active species (anion and cation), the method in which the heat-active latent curing agent (E) is stably dispersed in the thermosetting adhesive component (B) at about room temperature and becomes compatibilized with or dissolved in the thermosetting adhesive component at elevated temperatures to thereby initiate a curing reaction, the method in which a curing agent sealed in a molecular sieve is leached at elevated temperatures to thereby initiate a curing reaction and the method in which use is made of a microcapsule.

These heat-active latent curing agents (E) can be used either individually or in combination.

In the present invention, when an epoxy resin is used as the thermosetting adhesive component (B), any of dicyandiamide, imidazole compounds and mixtures thereof can preferably be used as the heat-active latent curing agent (E).

When a phenolic resin is used as the thermosetting adhesive component (B), any of hexamethylenetetramine, blocked isocyanate compounds and mixtures thereof can preferably be used as the heat-active latent curing agent (E).

When an unsaturated polyester resin is used as the thermosetting adhesive component (B), an organic peroxide can preferably be used as the heat-active latent curing agent (E).

When a polyurethane resin is used as the thermosetting adhesive component (B), a polyol/blocked isocyanate compound can preferably be used as the heat-active latent curing agent (E).

It is generally preferred that the heat-active latent curing agent (E) be used in an amount of 0.1 to 20 parts by weight, especially 0.5 to 15 parts by weight, and still especially 1 to 10 parts by weight, per 100 parts by weight of the thermosetting adhesive component (B).

The matrix forming component (F) is a component which itself polymerizes and is cured without reacting with the above components (A) to (E) to thereby form a three-dimensional network structure. The curing of the matrix forming component (F) prior to the curing of the thermosetting adhesive component (B) suppresses the shrinkage at heating and cooling of the adhesive component during the curing thereof to thereby contribute to the enhancement of adherence, because of the formation of the three-dimensional network structure in adhesive composition.

The matrix forming component (F) can be composed of various compounds without any particular limitation as long as they themselves polymerize and are cured without reacting with the above components (A) to (E) to thereby form a three-dimensional network structure. Preferred use is made of energy beam polymerizable compounds. The energy beam polymerizable compounds are compounds which polymerize and are cured upon being irradiated with an energy beam such as ultraviolet rays or electron beams. These compounds each have at least one polymerizable double bond in the molecule, and their molecular weight is generally in the range of about 100 to 30,000, preferably about 300 to 10,000. For example, low-molecular-weight compounds as disclosed in Japanese Patent Laid-open Publication Nos. 60(1985)-196,956 and 60(1985)-223,139 are widely used as these energy beam polymerizable compounds. Examples thereof include acrylate compounds such as trimethylolpropane triacrylate, tetramethylolmethane tetraacrylate, pentaerythritol triacrylate, dipentaerythritol monohydroxypentaacrylate, dipentaerythritol hexaacrylate, 1,4-butylene glycol diacrylate, 1,6-hexanediol diacrylate, polyethylene glycol diacrylate and commercially available oligoester acrylate.

Furthermore, besides the above acrylate-based compounds, urethane acrylate-based oligomers can be used as the energy beam polymerizable compounds. Urethane acrylate oligomers can be obtained by reacting an isocyanate-terminated urethane prepolymer which is obtained by a polyol compound of a polyester or polyether type with a polyisocyanate compound such as 2,4-tolylene diisocyanate, 2,6-tolylene diisocyanate, 1,3-xylylene diisocyanate, 1,4-xylylene diisocyanate or diphenylmethane-4,4-diisocyanate with a (meth)acrylic ester having a hydroxyl group such as 2-hydroxyethyl (meth)acrylate, 2-hydroxypropyl (meth)acrylate or polyethylene glycol (meth)acrylate. The thus obtained urethane acrylate oligomers each have at least one carbon to carbon double bond.

These urethane acrylate oligomers preferably have a molecular weight of 3000 to 30,000, still preferably 3000 to 10,000, and yet still preferably 4000 to 8000.

Still further, use can be made of oligomers having a functional group such as hydroxyl or carboxyl, for example, epoxy modified acrylates, polyester acrylates, polyether acrylates and itaconic acid oligomers.

The adhesive composition which contains the above energy beam polymerizable compound is cured upon being irradiated with an energy beam. For example, ultraviolet rays or electron beams are used as the energy beam.

When ultraviolet rays are employed as the energy beam, the polymerization curing time and radiation exposed dose can be reduced by mixing a photopolymerization initiator in the adhesive composition.

The photopolymerization initiator is, for example, selected from among benzophenone, acetophenone, benzoin, benzoin methyl ether, benzoin ethyl ether, benzoin isopropyl ether, benzoin isobutyl ether, benzoin benzoic acid, methyl benzoin benzoate, benzoin dimethylketal, 2,4-diethylthioxanthone, α-hydroxycyclohexyl phenyl ketone, benzyl diphenyl sulfide, tetramethylthiuram monosulfide, azobisisobutyronitrile, benzil, dibenzyl, diacetyl and β-chloroanthraquinone.

Although the proportion of added matrix forming component (F) is appropriately determined depending on the characteristics of the components, it is generally preferred that the matrix forming component (F) be used in an amount of about 1 to 30 parts by weight, especially 5 to 15 parts by weight, per 100 parts by weight of the total of the components (A) to (C).

The adhesive composition of the present invention can be blended with a filler (G) in order to control the coefficient of linear expansion and internal stress attributed to curing shrinkage during the curing of the adhesive according to necessity. Any of various common organic and inorganic fillers can be used as the filler (G) without any particular limitation.

In particular, for imparting antistatic and electrically conductive properties, the adhesive composition may be blended with an electrically conductive filler such as gold, silver, copper, nickel, aluminum, stainless steel, carbon, ceramic or a material obtained by coating nickel, aluminum or the like with silver. Further, for imparting thermally conductive properties, the adhesive composition may be blended with a thermally conductive filler such as gold, silver, copper, nickel, aluminum, stainless steel, silicon, germanium or other metallic material or an alloy thereof. This filler (G) is preferably added in an amount of about 5 to 950 parts by weight, still preferably 10 to 850 parts by weight, per 100 parts by weight of the total of the components (A) to (C). The average particle size of the filler (G) is preferably in the range of 0.5 to 20 $\mu$m, still preferably 2 to 10 $\mu$m.

The adhesive composition composed of the above components has excellent initial adherence and thermal curability and is useful in the bonding of various adherends. Especially, the adhesive composition can finally provide, through thermal curing, a curing product having high impact resistance, and further the adhesive composition has a desirable balance of shear strength and peel strength and can maintain satisfactory adherent properties even under severe thermal and moist conditions. Therefore, the adhesive composition can suitably be employed in the bonding of various metal members exposed to severe use conditions. Moreover, the adhesive composition is excellent in storage stability, so that, for example, even after the storage at high temperature for a prolonged period of time, various adherends can be bonded with high bonding strength.

This adhesive composition can be blended with an organic polyisocyanate compound, an organic polyimine compound and the like in order to regulate the initial adhesive strength and cohesive strength thereof.

The organic polyisocyanate compound can be, for example, selected from among aromatic polyisocyanate compounds, aliphatic polyisocyanate compounds, alicyclic polyisocyanate compounds, trimers of these polyisocyanate compounds and isocyanate terminated urethane prepolymers obtained by reacting these polyisocyanate compounds with polyol compounds. Specific examples of the organic polyisocyanate compounds include 2,4-tolylene diisocyanate, 2,6-tolylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate and lysine isocyanate.

Specific examples of the above organic polyimine compounds include N,N'-diphenylmethane-4,4'-bis(1-aziridinecarboxyamide), trimethylolpropane-tri-β-aziridinyl propionate, tetramethylolmethane-tri-β-aziridinyl propionate and N,N'-toluene-2,4-bis(1-aziridinecarboxyamido) triethylenemelamine.

For regulating the adhesive strength, cohesive strength, tack, molecular weight, molecular weight distribution, elasticity, glass transition temperature, hydrophilicity, water resistance, aptitude for coating, etc., the adhesive composition of the present invention can be doped with a hydrophilic plasticizer such as a water soluble polyhydric alcohol, a tackifier resin, a pigment, a dye, a deforming agent, an antiseptic, etc. according to necessity in an amount not detrimental to the object of the present invention. These other components are preferably added in an amount of about 0.01 to 20 parts by weight per 100 parts by weight of the total of the components (A) to (C), depending on the particular purpose of the addition of each individual component.

An adhesive sheet according to the present invention can be obtained by first coating a release sheet with the adhesive composition composed of the above components according to the customary technique employing a knife coater ("comma coater", trade name), gravure coater, die coater, reverse coater or the like, subsequently drying the composition to thereby form an adhesive layer on the release sheet and thereafter removing the release sheet.

Further, the adhesive sheet can be produced by coating a substrate with the adhesive composition according to the above technique and drying the composition to thereby form an adhesive layer. The substrate can be, for example, selected from among films of polyethylene, polypropylene, polybutene, polybutadiene, polymethylpentene, polyvinyl chloride, vinyl chloride copolymer, polyethylene terephthalate, polybutylene terephthalate, polyurethane, ethylene/vinyl acetate copolymer, ionomer resin, ethylene/(meth)acrylic acid copolymer, ethylene/(meth)acrylic ester copolymer, polystyrene and polycarbonate. Also, use can be made of films produced by crosslinking these and films composed of laminates thereof. Further, use can be made of opaque films produced by coloring the above films, fluororesin films and the like.

The surface tension of the substrate is preferably 40 dyne/cm or less, still preferably 37 dyne/cm or less, and yet still preferably 35 dyne/cm or less. This enables transferring of the adhesive layer of the sheet of the present invention to adherends. The above substrate with low surface tension can be obtained by selecting appropriate material. Also, it can be obtained by subjecting the surface of the substrate to release treatment such as application of silicone resin or the like. Further, use can be made of paper substrates, for example, glassine paper, coated papers such as clay coated paper and resin coated paper and laminated papers such as polyethylene laminated paper and polypropylene laminated paper. The adhesive sheet can be obtained by coating either one side or both sides of the substrate with the adhesive composition of the present invention. Not only the above papers and plastic films but also nonwoven fabrics and metal foils can be used as the substrate. When nonwoven fabrics are used, the adhesive sheet maybe produced by impregnating them with the adhesive composition.

The thickness of the substrate is generally in the range of about 10 to 300 μm, preferably 20 to 200 μm, and still preferably 50 to 150 μm.

According to necessity, the above adhesive composition can be dissolved or dispersed in a solvent prior to the application thereof.

It is generally preferred that the thickness of the adhesive layer of the adhesive sheet of the present invention be in the range of 3 to 100 μm, especially 10 to 60 μm.

The thus obtained adhesive sheet can be used in the following manner.

First, the adhesive sheet is pressed against a predetermined bonding site of an adherend of, for example, a metal. Subsequently, only the substrate or release sheet is peeled off to thereby accomplish transferring of the adhesive layer onto the adherend. In that instance, if the matrix forming component is brought to a cured state according to necessity, the adhesive strength is reduced to thereby facilitate peeling of the substrate or release sheet. Thereafter, another object to be fixed on the adherend is pressed against the adhesive layer at the above bonding site and heated. This heating cures the thermosetting adhesive component of the adhesive layer, so that the adherend and the other object are bonded together with satisfactory strength.

The adhesive sheet of the present invention is excellent in storage stability and enables bonding metals, etc. with desirable bonding strength. Further, it is in the form of a sheet, so that an appropriate amount of adhesive can be transferred onto adherend surfaces. Liquid runs can be avoided and bonding operation can be simplified.

Moreover, the adhesive sheet of the present invention can be utilized in the bonding of semiconductor compounds, glasses, ceramics and metals as well as the above uses. Also, the adhesive sheet can be employed in the direct die bonding of, for example, semiconductor chips.

When the adhesive sheet of the present invention is employed in the direct die bonding of semiconductor chips, it is preferred that the matrix forming component (F) be contained in the adhesive layer.

The adhesive composition of the present invention enables bonding metals, etc. with high bonding strength and can be sheeted, so that an appropriate amount of adhesive can be transferred onto adherend surfaces and liquid runs can be avoided to thereby simplify bonding operation. Furthermore, the adhesive composition of the present invention is excellent in storage stability, so that, even after storage at high temperature, various adherends can be bonded thereby with desirable bonding strength.

EXAMPLE

The present invention will further be illustrated below with reference to the following Examples which in no way limit the scope of the invention.

In the following Examples and Comparative Examples, the "peel strength" was evaluated in the following manner.

Measurement of peel strength

Each of the adhesive compositions produced in the Examples and Comparative Examples was formed into an adhesive sheet having an adhesive layer of 50 μm thickness. Soft steel plates (200 mm×25 mm×0.3 mm) were stuck to each other by means of the adhesive layer of the adhesive sheet interposed therebetween. The thus obtained laminate was held in a 180° C. oven for 30 minutes to thereby cure the adhesive layer. Thus, bonding of the soft steel plates was accomplished.

T-type-peeling was performed at a measuring speed of 10 mm/min in accordance with Japanese Industrial Standard K 6850 to thereby obtain the peel strength.

Further, for measuring the storage stability, release films were stuck to both sides of each adhesive layer (50 μm thick) and held in a 50° C. thermostat for 5 days. With respect to the adhesive layer, the peel strength was measured in the same manner as described above.

In the following Examples, the following materials were employed as the pressure sensitive adhesive component (A), thermosetting adhesive component (B), compound (C) obtained by addition/condensation reaction of a polysiloxane oligomer with a silane coupling agent, flexible component (D), heat-active latent curing agent (E) matrix forming component (F) and filler (G).

(A) pressure sensitive adhesive component (acrylic polymer):

copolymer having a weight average molecular weight of 900,000 and a glass transition temperature of −28° C., obtained by copolymerizing 55 parts by weight of butyl acrylate, 10 parts by weight of methyl methacrylate, 20 parts by weight of glycidyl methacrylate and 15 parts by weight of 2-hydroxyethyl acrylate.

(B) thermosetting adhesive component (epoxy resin):

(B1) liquid bisphenol A epoxy resin (epoxy equivalent: 180 to 200), (B2) solid bisphenol A epoxy resin (epoxy equivalent: 800 to 900), and (B3) o-cresol novolak epoxy resin (epoxy equivalent: 210 to 230).

(C) compound obtained by addition/condensation reaction of a polysiloxane oligomer with a silane coupling agent:

compound obtained by subjecting polymethoxysiloxane and γ-glycidoxypropyltrimethoxysilane to addition/condensation (MKC silicate MSEP2 (trade name), produced by Mitsubishi Chemical K.K.).

(D) flexible component:

(D1) fine particles of acrylic rubber, and (D2) polyester resin (Vylon 200 (trade name) produced by Toyobo Co., Ltd.).

(E) heat-active latent curing agent:

(E1) dicyandiamide (Hardener 3636AS (trade name), produced by Asahi Denka Kogyo K.K.), and (E2) 2-phenyl-4,5-hydroxymethylimidazole (Curazol 2PHZ (trade name), produced by Shikoku Chemicals Corporation).

(F) matrix forming component:

urethane acrylate oligomer (molecular weight: about 5000).

(G) filler:

(G1) fused silica powder (average particle size: 3 to 4 $\mu$m), and (G2) silver powder (average particle size: 4 to 8 $\mu$m, flaky).

Further, the following additives were used.

Silane coupling agent:

(SiC) γ-glycidoxypropyltrimethoxysilane (KBM 403 (trade name), produced by Shin-E-su Chemical Co., Ltd.).

Photopolymerization initiator:

(PI) 1-hydroxycyclohexyl phenyl ketone.

Other (crosslinking agent):

(API) aromatic polyisocyanate.

Examples 1 to 10 and Comparative Examples 1 to 7

The components specified in Table 1 were blended together in the proportions specified in Table 1, thereby obtaining adhesive compositions. With respect to each of the adhesive compositions, the "peel strength" was evaluated in the above manner. The results are given in Table 1.

With respect to the adhesive compositions of the Examples, the peel strength measured after allowing them to stand in an atmosphere heated at 50° C. for 5 days exhibited only slight decreases as compared with that measured in the ordinary state. However, the adhesive compositions of the Comparative Examples exhibited large decreases of peel strength.

TABLE 1

| | Adhesive composition (parts by weight) | | | | | | | | | | | | | | | Peel strength (N/25 mm) | |
|---|---|---|---|---|---|---|---|---|---|---|---|---|---|---|---|---|---|
| | | B | | | | D | | E | | | G | | | | | | after heating at |
| | A | B1 | B2 | B3 | C | D1 | D2 | E1 | E2 | F | G1 | G2 | SiC | PI | API | ordinary state | 50° C. for 5 days |
| Example 1 | 10 | 24 | 10 | | 0.05 | 6 | | 1.5 | 1.5 | 10 | | | | | 1 | 26 | 24 |
| Example 2 | 10 | 24 | | 10 | 0.05 | 6 | | 1.5 | 1.5 | 10 | | | | | 1 | 28 | 28 |
| Example 3 | 10 | 24 | 10 | | 0.05 | 6 | 5 | 1.5 | 1.5 | | | | | | 1 | 30 | 29 |
| Example 4 | 10 | 24 | | 10 | 0.05 | 6 | 5 | 1.5 | 1.5 | | | | | | 1 | 32 | 30 |
| Example 5 | 10 | 24 | 10 | | 0.05 | 6 | | 1.5 | 1.5 | 5 | | | | 0.2 | 1 | 24 | 22 |
| Example 6 | 10 | 24 | | 10 | 0.05 | 6 | | 1.5 | 1.5 | 5 | | | | 0.2 | 1 | 25 | 25 |
| Example 7 | 10 | 40 | | 10 | 0.05 | 10 | | 2.5 | 2.5 | | | 500 | | | 1 | 36 | 35 |
| Example 8 | 10 | 24 | | 10 | 0.05 | | | 1.5 | 1.5 | 5 | | | | 0.2 | 1 | 20 | 18 |
| Example 9 | 10 | 24 | | 10 | 0.05 | | | 1.5 | 1.5 | | 10 | | | | 1 | 21 | 18 |
| Example 10 | 10 | 24 | | 10 | 0.05 | | | 1.5 | 1.5 | | | | | | 1 | 15 | 13 |
| Comp. Ex. 1 | 10 | 24 | 10 | | | 6 | | 1.5 | 1.5 | 10 | | | 0.05 | | 1 | 24 | 9 |
| Comp. Ex. 2 | 10 | 24 | | 10 | | 6 | 5 | 1.5 | 1.5 | | | | 0.05 | | 1 | 33 | 11 |
| Comp. Ex. 3 | 10 | 24 | | 10 | | 6 | | 1.5 | 1.5 | 5 | | | 0.05 | 0.2 | 1 | 23 | 7 |
| Comp. Ex. 4 | 10 | 24 | | 10 | | 6 | | 1.5 | 1.5 | | 10 | | 0.05 | | 1 | 23 | 9 |
| Comp. Ex. 5 | 10 | 24 | | 10 | | | | 1.5 | 1.5 | 5 | | | 0.05 | 0.2 | 1 | 18 | 5 |
| Comp. Ex. 6 | 10 | 24 | | 10 | | | | 1.5 | 1.5 | | 10 | | 0.05 | | 1 | 18 | 5 |
| Comp. Ex. 7 | 10 | 24 | | 10 | | | | 1.5 | 1.5 | | | | 0.05 | | 1 | 10 | <1 |

What is claimed is:

1. An adhesive composition comprising a pressure sensitive adhesive component (A), a thermosetting adhesive component (B) and a compound (C) obtained by addition/condensation reaction of a polysiloxane oligomer with a silane coupling agent.

2. The adhesive composition as claimed in claim 1, which further comprises a flexible component (D).

3. The adhesive composition as claimed in claim 1, which further comprises a heat-active latent curing agent (E).

4. The adhesive composition as claimed in claim 2, which further comprises a heat-active latent curing agent (E).

5. The adhesive composition as claimed in claim 1, which further comprises a matrix forming component (F).

6. The adhesive composition as claimed in claim 2, which further comprises a matrix forming component (F).

7. The adhesive composition as claimed in claim 3, which further comprises a matrix forming component (F).

8. The adhesive composition as claimed in claim 4, which further comprises a matrix forming component (F).

9. The adhesive composition as claimed in claim 1, which further comprises a filler (G).

10. The adhesive composition as claimed in claim 2, which further comprises a filler (G).

11. The adhesive composition as claimed in claim 3, which further comprises a filler (G).

12. The adhesive composition as claimed in claim 4, which further comprises a filler (G).

13. The adhesive composition as claimed in claim 5, which further comprises a filler (G).

14. The adhesive composition as claimed in claim 6, which further comprises a filler (G).

15. The adhesive composition as claimed in claim 7, which further comprises a filler (G).

16. The adhesive composition as claimed in claim 8, which further comprises a filler (G).

17. The adhesive composition as claimed in claim 9, wherein the filler (G) is a conductive filler.

18. An adhesive sheet comprising the adhesive composition as claimed in claim 1.

19. An adhesive sheet comprising the adhesive composition as claimed in claim 17.

20. The adhesive composition as claimed in claim 10, wherein the filler (G) is a conductive filler.

21. The adhesive composition as claimed in claim 11, wherein the filler (G) is a conductive filler.

22. The adhesive composition as claimed in claim 12, wherein the filler (G) is a conductive filler.

23. The adhesive composition as claimed in claim 13, wherein the filler (G) is a conductive filler.

24. The adhesive composition as claimed in claim 14, wherein the filler (G) is a conductive filler.

25. The adhesive composition as claimed in claim 15, wherein the filler (G) is a conductive filler.

26. The adhesive composition as claimed in claim 16, wherein the filler (G) is a conductive filler.

* * * * *

UNITED STATES PATENT AND TRADEMARK OFFICE
CERTIFICATE OF CORRECTION

PATENT NO. : 6,277,481 B1
DATED : August 21, 2001
INVENTOR(S) : Takashi Sugino et al.

It is certified that error appears in the above-identified patent and that said Letters Patent is hereby corrected as shown below:

Title page,
Item [*], insert: -- This patent issued on a continued prosecution application filed under 37 CFR 1.53(d), and is subject to the twenty year patent term provisions of 35 U.S.C. 154(a)(2). --

Column 5,
Line 2, after "Component (A)" insert period (.).

Signed and Sealed this

Thirtieth Day of April, 2002

*Attest:*

*Attesting Officer*

JAMES E. ROGAN
*Director of the United States Patent and Trademark Office*